United States Patent
Tsai et al.

(10) Patent No.: US 8,869,436 B2
(45) Date of Patent: Oct. 28, 2014

(54) RESISTIVE SWITCHING RANDOM ACCESS MEMORY STRUCTURE AND METHOD TO RECREATE FILAMENT AND RECOVER RESISTANCE WINDOW

(71) Applicant: Taiwan Semiconductor Manufacturing Company, Ltd., Hsin-Chu (TW)

(72) Inventors: Chun-Yang Tsai, New Taipei (TW); Yu-Wei Ting, Taipei (TW); Kuo-Ching Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/779,030

(22) Filed: Feb. 27, 2013

(65) Prior Publication Data

US 2014/0241034 A1     Aug. 28, 2014

(51) Int. Cl.
  *G11C 11/00* (2006.01)
  *G11C 13/00* (2006.01)

(52) U.S. Cl.
  CPC ........ *G11C 13/0002* (2013.01); *G11C 13/0004* (2013.01)
  USPC .......... 36/148; 365/46; 365/55; 365/74; 365/97; 365/100; 365/131; 365/148; 365/158; 365/171; 365/173; 365/163

(58) Field of Classification Search
  CPC .......... G11C 13/0004; G11C 13/0038; G11C 13/004; G11C 13/0061
  See application file for complete search history.

(56) References Cited

U.S. PATENT DOCUMENTS

| | | | |
|---|---|---|---|
| 2012/0069626 A1* | 3/2012 | Nakano et al. | 365/148 |
| 2012/0099364 A1* | 4/2012 | Park et al. | 365/148 |

OTHER PUBLICATIONS

Y. S. Chen, et al, Highly Scalable Hafnium Oxide Memory with Improvements of Resistive Distrnution and Read Disturb Immunity, 2009, Proc. IEEE Int. Electron Devices Meeting, pp. 105-108.*
H. S. Philip Wong et al., "Metal-Oxide RRAM," Proceedings of the IEEE, vol. 100, No. 6, Jun. 2012, pp. 1951-1970.

* cited by examiner

*Primary Examiner* — Fernando Hidalgo
(74) *Attorney, Agent, or Firm* — Haynes and Boone, LLP

(57) ABSTRACT

The present disclosure provides one embodiment of a method for operating a resistive random access memory (RRAM) cell. The method includes performing a forming operation to the RRAM cell with a forming voltage; performing a number of set/reset operation cycles to the RRAM cell; and performing a recreating process to the RRAM cell to recover RRAM resistance by applying a recreating voltage. Each of the number of set/reset operation cycles includes a set operation with a set voltage. The recreating voltage is greater than the set voltage.

22 Claims, 8 Drawing Sheets

88

| OPERATION | | 1st-STEP | 2nd STEP (OPTIONAL) |
|---|---|---|---|
| WL | SELECT | $V_{WL\_recreate1} > V_{WL\_set}$ | $V_{WL\_recreate2}$ |
| | NON-SELECT | 0 | 0 |
| BL | SELECT | $V_{BL\_recreate1} > V_{BL\_set}$ | 0 |
| | NON-SELECT | 0 | 0 |
| SL | SELECT | 0 | >0 |
| | NON-SELECT | 0 | 0 |

| OPERATION | | SET | RESET | READ |
|---|---|---|---|---|
| WL | SELECT | $V_{WL\_set} > 0$ | $V_{WL\_reset} > 0$ | >0 |
| | NON-SELECT | 0 | 0 | 0 |
| BL | SELECT | $V_{BL\_set} > 0$ | 0 | >0 |
| | NON-SELECT | 0 | 0 | 0 |
| SL | SELECT | 0 | >0 | 0 |
| | NON-SELECT | 0 | 0 | 0 |

| OPERATION | | 1st-STEP | 2nd STEP (OPTIONAL) |
|---|---|---|---|
| WL | SELECT | $V_{WL\_recreate1} > V_{WL\_set}$ | $V_{WL\_recreate2}$ |
| | NON-SELECT | 0 | 0 |
| BL | SELECT | $V_{BL\_recreate1} > V_{BL\_set}$ | 0 |
| | NON-SELECT | 0 | 0 |
| SL | SELECT | 0 | >0 |
| | NON-SELECT | 0 | 0 |

RESISTIVE SWITCHING RANDOM ACCESS MEMORY STRUCTURE AND METHOD TO RECREATE FILAMENT AND RECOVER RESISTANCE WINDOW

BACKGROUND

In integrated circuit (IC) devices, resistive random access memory (RRAM) is an emerging technology for next generation non-volatile memory devices. A RRAM structure includes an array of RRAM cells each of which stores a bit of data using resistance values, rather than electronic charge. Particularly, each RRAM cell includes a resistive material layer, the resistance of which can be controlled to be high or low to represent logic "0" or logic "1", respectively. High and low and resistances each should have a large and stable resistance window for reliable readings.

In advanced technology nodes, the feature size scales down and the size of memory devices is reduced accordingly. However, the reduction of the RRAM devices causes poor endurance issue. During applications of a RRAM cell, the RRAM cell experiences a greater number of set and reset operation cycles. The initial resistance window is degraded after long time cycling, introducing reliability issue. It is important to have a small size RRAM cells with stable resistance window and good enduring performance.

Accordingly, it would be desirable to provide an improved RRAM structure and a method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
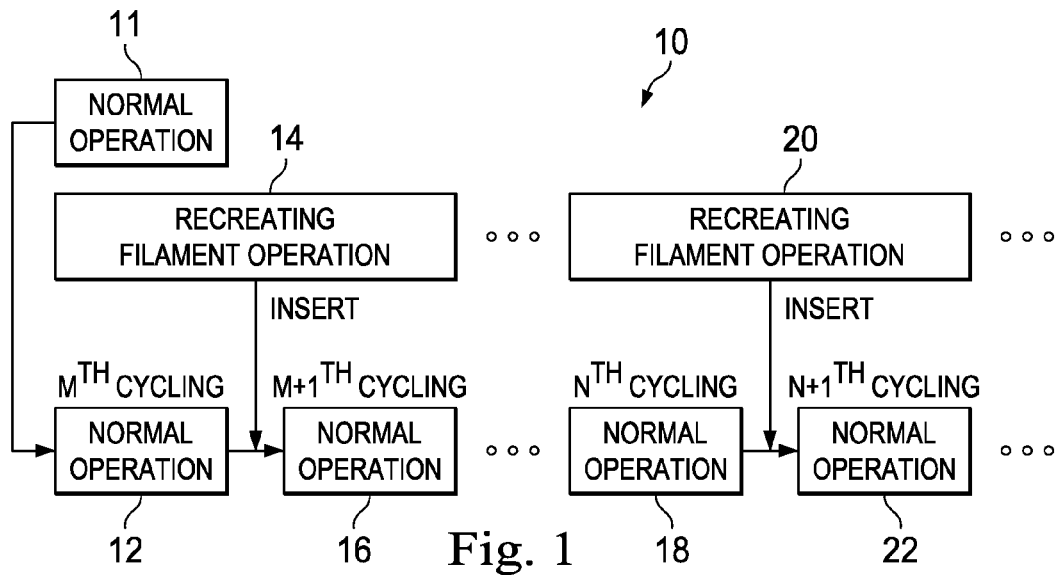
FIG. 1 is a block diagram of a method for operating a memory device constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a block diagram of a method 10 for operating a memory device constructed according to aspects of the present disclosure in one embodiment. The memory device is a resistive random access memory (RRAM) device having a resistive material layer sandwiched between two electrodes. The RRAM device will be further described later. The resistance of the RRAM device is set or reset to low or high to represent logic "1" or logic "0", respectively.

First as shown in block 11, a "forming" process (or operation) is applied to the RRAM device. The forming process is designed to change the structure of the resistive material layer of the RRAM device such that a conductive path is generated therein. In the forming process, a forming voltage is applied to the two electrodes of the RRAM device. For example, the bottom electrode is connected to a low voltage $V_{low}$ and the top electrode is connected to a high voltage $V_{high}$. The difference of $V_{high}-V_{low}$ provides the forming voltage. In the "forming" operation, the "forming" voltage is high enough to generate conductive features in the resistive material layer. In one example, the conductive features include a plurality of conductive filament to provide a conductive path such that the resistive material layer is "on" or in low resistance state. The conductive path may be related to the lineup of the oxygen vacancies in the resistive material layer.

In another embodiment, the forming process includes two steps: a first forming step applies a first (forming) voltage Vf1 to the RRAM device and a second forming step applies a second (forming) voltage Vf2 to the RRAM device, wherein the second voltage is different from the first voltage. Particularly, in the first forming step, the first voltage is applied to the RRAM device in a first direction (or first polarity). In the second forming step, the second voltage is applied to the RRAM device in a second direction (or second polarity) that is opposite to the first direction. Therefore, the forming process is also referred to as bidirectional forming process. The first forming step is also referred to a forward forming step and the second forming step is referred to as a reverse forming step. In one embodiment, the first voltage Vf1 is greater than the second voltage Vf2 in magnitude.

At block 12, the RRAM device experiences a number of set and reset operation cycles (also referred to as set/reset operation cycles), such as "M" cycles. The initial resistance window is degraded over the cycling.

Thereafter as illustrated in block 14, a recreating operation (or process) is applied to the RRAM device to recreate filament and recover the RRAM device from the resistance degradation, in which the resistance of the RRAM device is completely or at least partially recovered to its initial stages after the "forming" process (in other words, the resistance is improved). The recreating process is designed to recover the resistance of the RRAM device. Thus, the resistances (especially the low resistance) remain a large and stable resistance window for reliable readings.

In one embodiment, the recreating process includes applying a recreating voltage to the RRAM device. The recreating voltage is applied in a polarity of a set operation. The recreating voltage is greater than a set voltage of the set operation. In one example, the recreating voltage is less than a "forming" voltage of a "forming" operation.

In another embodiment, the recreating process is a bidirectional recreating process that includes two steps: applying a first voltage in a first polarity and applying a second voltage in a second polarity to the RRAM device. In furtherance of the embodiment, the set and reset operations are based on bipolar switching effect and are applied in opposite polarities. In the present example, the set operation includes applying a set voltage to the RRAM device in the first polarity and the reset operation includes applying a reset voltage to the RRAM device in the second polarity. In this case, the first voltage in the first step of the recreating process is greater than the set voltage and the second voltage in the second step of the recreating process is greater than the reset voltage.

Thereafter, the RRAM device goes through normal operations (set and reset), such as the next normal operation ($M+1^{th}$ cycle) as illustrated in block 16.

This flow is continues with a recreating process is inserted in the normal operations when the resistance of the RRAM device needs to be recovered from the resistance degradation. For example, after another number of set/reset operation cycles, such as $N^{th}$ as illustrated in block 18, another recreating process, as illustrated in block 20 is applied to the RRAM device to recreate filament and recover the resistance of the RRAM device. Thereafter, the RRAM device goes through normal operations (set and reset), such as the next normal operation ($N+1^{th}$ cycle) as illustrated in block 22.

The recreating process is inserted in the normal operations of the RRAM device in various modes. In one embodiment, the recreating process is inserted in the normal operations of the RRAM device in a time mode. A number $N_0$ is predetermined according to the data of resistance degradation of the RRAM device. After every $N_0$ set/reset operation cycles, a recreating process is applied to the RRAM device to recreate filament.

In another embodiment, the recreating process is inserted in the normal operations of the RRAM device in a detection mode. A reference current is determined for the RRAM device (also referred to as the predefined reading current), according to the reading consistence, stability and/or repeatability. During the normal operations, when the RRAM device is addressed for a normal operation, the reading current of the RRAM device is captured and compared with the reference current. If the reading current is less than the reference current, a recreating process is applied to the RRAM device to recreate filament.

In yet another embodiment, the recreating process is inserted in the normal operations of the RRAM device in a time and detection mode. During the normal operations, if the reading current is less than the reference current or when the number of set/reset operation cycles is equals to or greater than the predetermined number $N_0$, a recreating process is applied to the RRAM device to recreate filament.

FIG. 2-5 are diagrams illustrating current behaviors of a RRAM cell during various operations constructed according to aspects of the present disclosure in various embodiments. The method 10 is further explained with reference to FIGS. 2-5.

Figure 2:
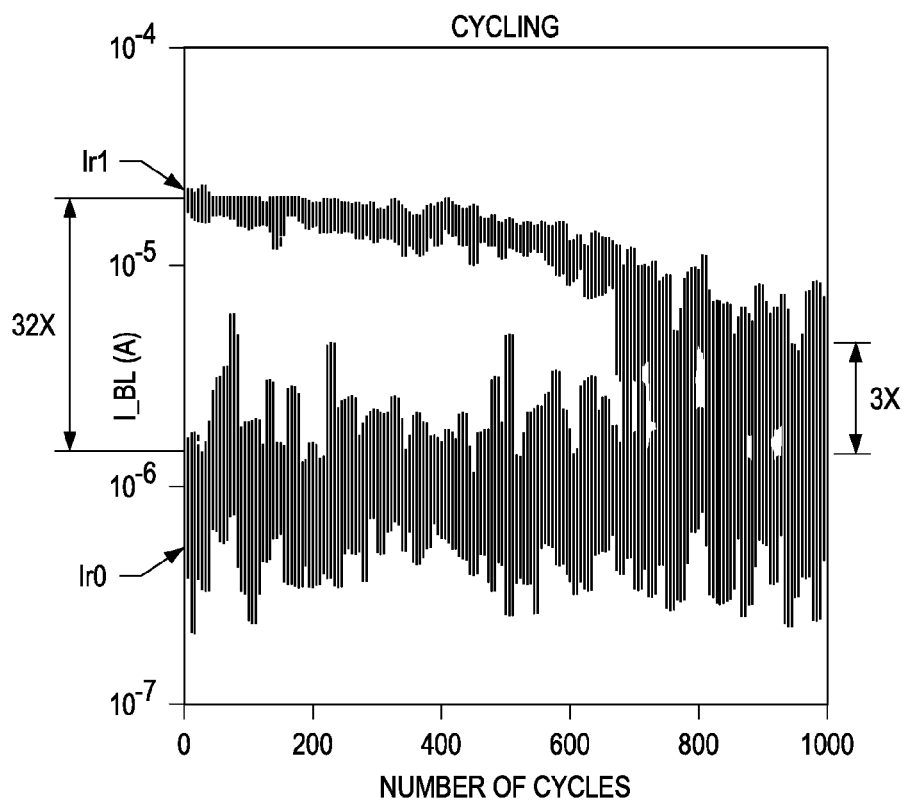
FIG. 2-5 are diagrams illustrating current behaviors of a RRAM cell during various operations constructed according to aspects of the present disclosure in various embodiments.
Figure 3:
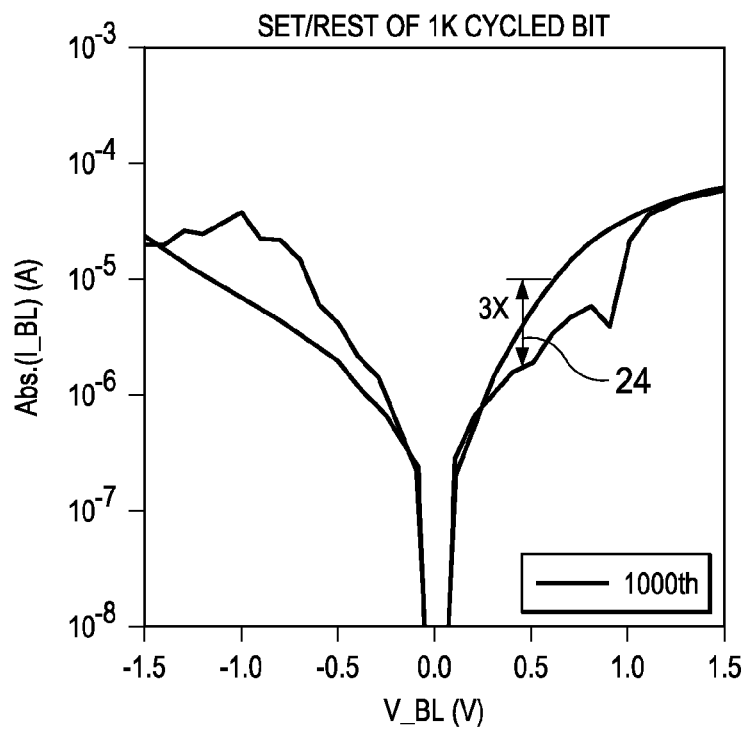

FIG. 2 illustrates the read current from the bit line of the RRAM device over operation time, specifically over a number of operation cycles. The read current has two windows representing "on" ("1") and "off" ("0") logic states, respectively. Use Ir1 and Ir0 to represent read currents for "on" and "off" states, respectively. Initially, the read current ratio Ir1/Ir0 is about 32 (labeled as "32X" in FIG. 2). Over the operation cycles, the ratio gradually drops. After 1000 operation cycles, the ratio drops to about 3 (labeled as "3X" in FIG. 2), as further illustrated in FIG. 3, which is current vs. voltage curve (I-V curve) of the RRAM device after 1000 operation cycles. The horizontal axis represents a voltage applied to the RRAM device and the vertical axis represents a current through the RRAM device. The corresponding unit is ampere (or A). The read current ratio 24 drops to about 3.

Figure 4:
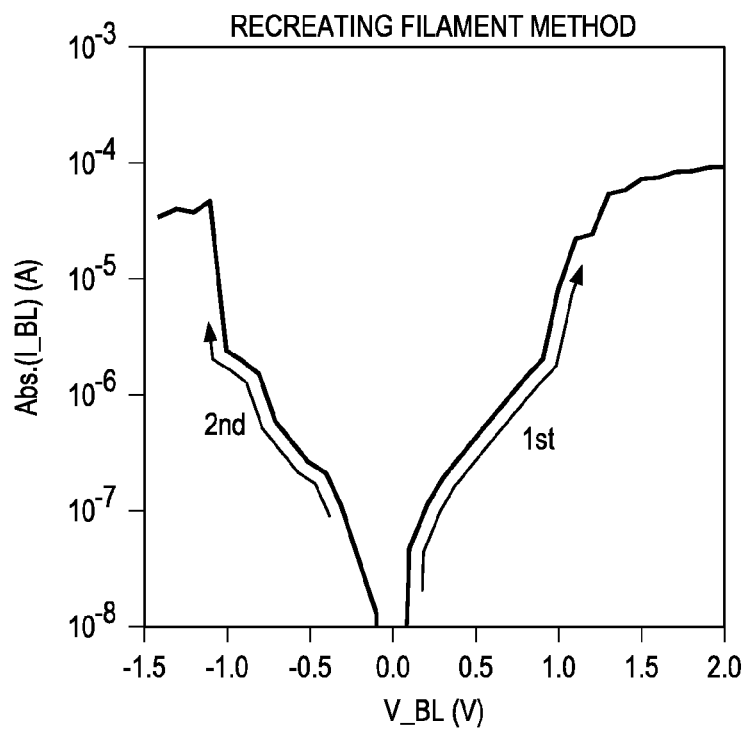

The recreating process (such as the recreating process at block 14 or 20) is illustrated in FIG. 4 as a diagram of a current vs. voltage curve of the RRAM device during a bidirectional recreating process constructed according to aspects of the present disclosure in one embodiment. The recreating process is a bidirectional recreating process that includes two steps: applying a first voltage (labeled as "$1^{st}$" in FIG. 4) in a first polarity and applying a second voltage (labeled as "$1^{st}$" in FIG. 4) in a second polarity to the RRAM device. The second polarity is opposite to the first opposite. In the present embodiment, the first voltage in the first step of the recreating process is greater than the set voltage and the second voltage in the second step of the recreating process is greater than the reset voltage.

Figure 5:
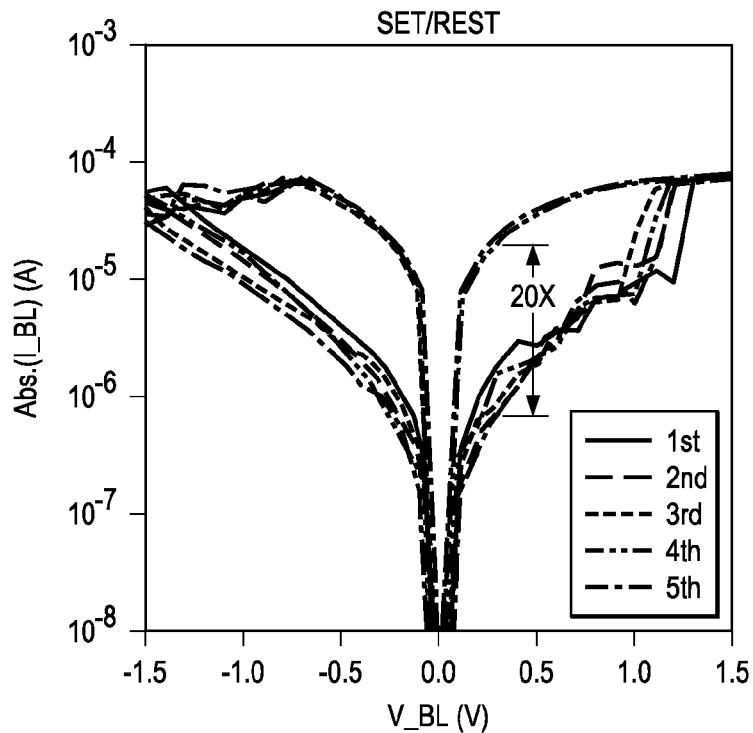

Thereafter, the RRAM device is back to the normal operations as illustrated in FIG. 5 as a diagram of a current vs. voltage curve of the RRAM device. Due to the recreating process, the RRAM device has a larger resistance window with the read current ratio being improved to about 20 (labeled as "20X" in FIG. 5).

Figure 6:
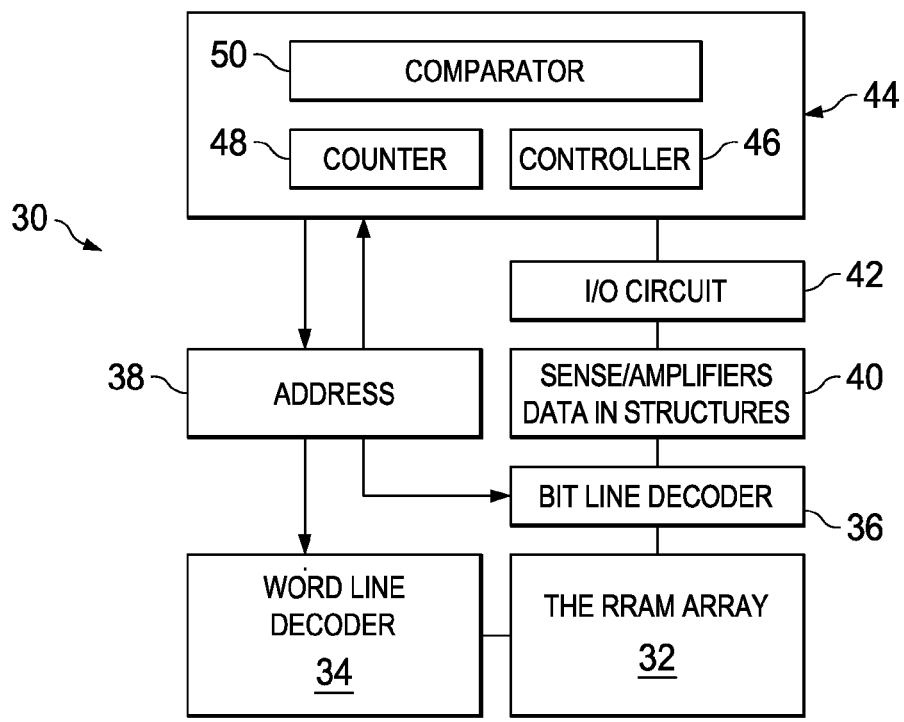
FIG. 6 is a block diagram illustrating a memory structure having a plurality of memory cells constructed according to aspects of the present disclosure in one embodiment.

FIG. 6 is a block diagram of a RRAM circuit (or RRAM structure) 30 constructed according to aspects of the present disclosure in one embodiment. The RRAM circuit 30 is operable to insert a recreating process for resistance window enhancement. Particularly, the RRAM circuit 30 is operable to perform a recreating process in time mode, detection and time-detection mode.

The RRAM circuit 30 includes a plurality of RRAM cells 32 configured in an array. In the present embodiment, each of the RRAM cells 32 includes a RRAM device and a transistor (such as a field-effect transistor or FET) coupled with the RRAM device. Each cell includes three terminals, word line, bit line and source line. The RRAM cells 32 will be further described later.

The RRAM circuit 30 includes a word line decoder 34 and a bit line decoder 36 coupled to the RRAM cells 32 for addressing. The RRAM circuit 30 includes a address module 38 coupled to the word line decoder 34 and the bit line decoder 36 pass the address data thereto.

The RRAM circuit 30 includes a sense amplifier (data in structure) 40 to amplify the input and output signals. The RRAM circuit 30 includes an input and output (I/O) circuit 42 to process the input and output signals. The I/O circuit 42 is coupled to the sense amplifier 40.

The RRAM circuit 30 includes a recreating module 34 designed and configured to perform a recreating process. The recreating module 44 is coupled to the address module 38 and the I/O circuit 42. The recreating module 34 is operable to insert a recreating process in time mode, detection mode or a time-detection hybrid mode.

The recreating module 44 includes a controller 46 to control the recreating process and provide the address data to the address module 38 for the corresponding RRAM cell to be recreated by the recreating process.

The recreating module 44 includes a counter 48 to keep a counting number of operation cycles (such as set and reset operation cycles) of each RRAM cell. For example, when a RRAM cell is addressed for an operation cycle, the counter 48 adds 1 to the counting number of that RRAM cell. The counting number of a RRAM cell is reset to zero after a recreating process is applied to that RRAM cell. Particularly, the counter 48 keeps a separate counting number for each RRAM cell. The counter 48 is coupled with the controller 46 for communications.

The recreating module 44 includes a comparator 50 designed to function for comparing a reading current of a RRAM cell to a reference current for a reading current difference. The comparator 50 is coupled with the controller 46. Furthermore, when the reading current difference is greater than a predefined value, the controller 46 is triggered to perform a recreating process to the corresponding RRAM cell.

Figure 7:
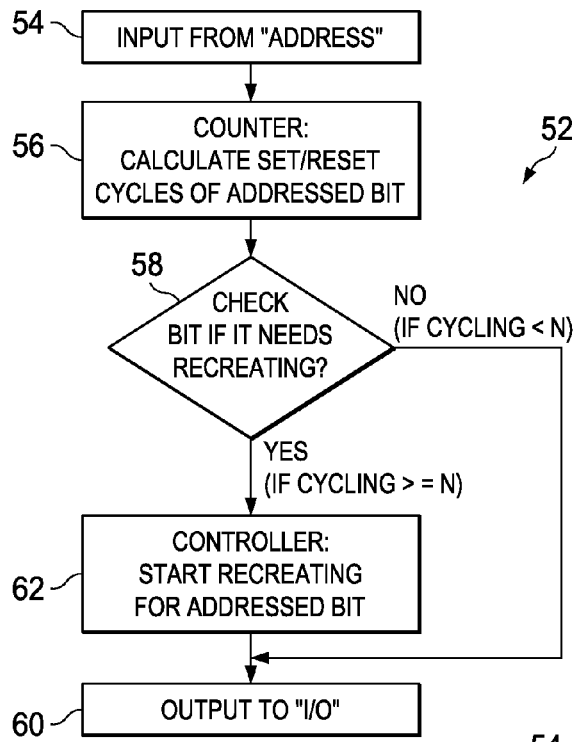
FIG. 7 is a flowchart of a method of operating the RRAM structure of FIG. 6 constructed according to aspects of the present disclosure in one embodiment.

FIG. 7 is a flowchart of a method 52 of operating the RRAM structure of FIG. 6 constructed according to aspects of the present disclosure in one embodiment. Especially, the method 52 includes inserting a recreating process to a RRAM cell in a time mode. In the present embodiment, the method 52 is enabled by and executed in the RRAM circuit 30. The method 52 is described with reference to FIGS. 6 and 7.

The method 52 begins at block 54 with input from the address module 38. The input includes the address associated with a RRAM cell of the RRAM array 32. Each RRAM cell has a counting number maintained in the counter 48.

When a RRAM cell is addressed for an operation (such as set and reset), the counting number of the corresponding RRAM cell in the counter 48 is checked for its value as illustrated in block 56. Assuming the counting number for that cell is "n", which presents a number of operation cycles after the initial informing process or after the last recreating process. In the present embodiment, the counting number of the RRAM cell is increased by 1 expressed as n=n+1.

The counting number of the RRAM cell is used to determine if a recreating process is needed to be applied to the corresponding RRAM cell (a cell is also referred to as a "bit") as illustrated in block 58.

When the counting number is less than a predefined number N, there is no need for a recreating process. The RRAM circuit 30 directly performs the corresponding operation, such as reading the RRAM cell and sending the reading output to the I/O circuit 42, as illustrated in block 60. In one embodiment, the number N is determined according to the resistance degradation data of the RRAM cell. In another embodiment, the number N may be determined individually to be particular for each individual cell or determined to be a universal number applicable to all cells of the RRAM array 32.

When the counting number is equals to or greater than the predefined number N, the controller 46 is triggered to start a recreating process to the corresponding RRAM cell (the addressed bit), as illustrated in block 62. The counting number n of the RRAM cell is reset to 0 as well.

Figure 8:
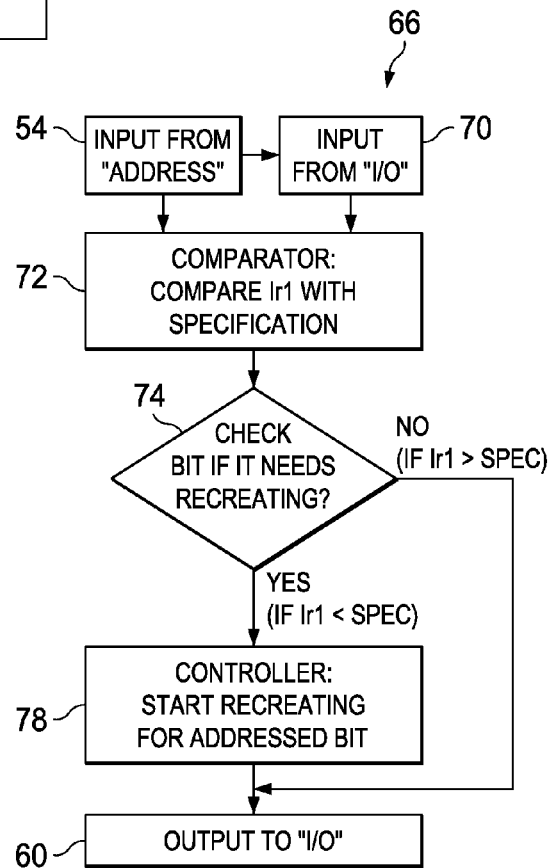
FIG. 8 is a flowchart of a method for operating the RRAM structure of FIG. 6 constructed according to aspects of the present disclosure in another embodiment.

FIG. 8 is a flowchart of a method 66 of operating the RRAM structure of FIG. 6 constructed according to aspects of the present disclosure in another embodiment. Especially, the method 66 includes inserting a recreating process to a RRAM cell in a detection mode. In the present embodiment, the method 66 is enabled by and executed in the RRAM circuit 30. The method 66 is described with reference to FIGS. 6 and 8.

The method 66 begins at block 54 with input from the address module 38. The input includes the address associated with a RRAM cell of the RRAM array 32.

The address data is sent to the I/O circuit 42 to capture the reading current of the addressed RRAM cell as illustrated in block 70. In one embodiment, the reading current may be captured from the RRAM cell by an operation including set, read and reset.

As illustrated in block 72, the reading current of the addressed RRAM cell is sent to the comparator 50 to compare the reading current of the RRAM cell and a reference current. The reading current may be a reading current of the RRAM at low resistance state, referred to as "Ir1" or a reading current of the RRAM cell at high resistance state, referred to as "Ir0". The reference current is determined by or defined in the product specification.

The reading current of the RRAM cell is used to determine if a recreating process is needed to be applied to the corresponding RRAM cell as illustrated in block 74.

The Ir1 is more sensitive to the resistance degradation. In one embodiment, when the reading current is Ir0, the RRAM circuit 30 bypasses comparison at block 72 and directly perform the corresponding operation, such as reading the RRAM cell and sending the reading output to the I/O circuit 42, as illustrated in block 60.

When the reading current is Ir1 as the RRAM cell is at logic "1", whether the addressed RRAM cell needs a recreating process is based on the comparison at block 72. If the reading current Ir1 is greater than a reference current (a predefined current), there is no need for a recreating process, the RRAM circuit 30 directly performs the corresponding operation to read the RRAM cell and send the read output to the I/O circuit 42, as illustrated in block 76. When the reading current is less than the predefined current, the controller 46 is triggered to start a recreating process to the corresponding RRAM cell, as illustrated in block 78.

Figures 9, 10:
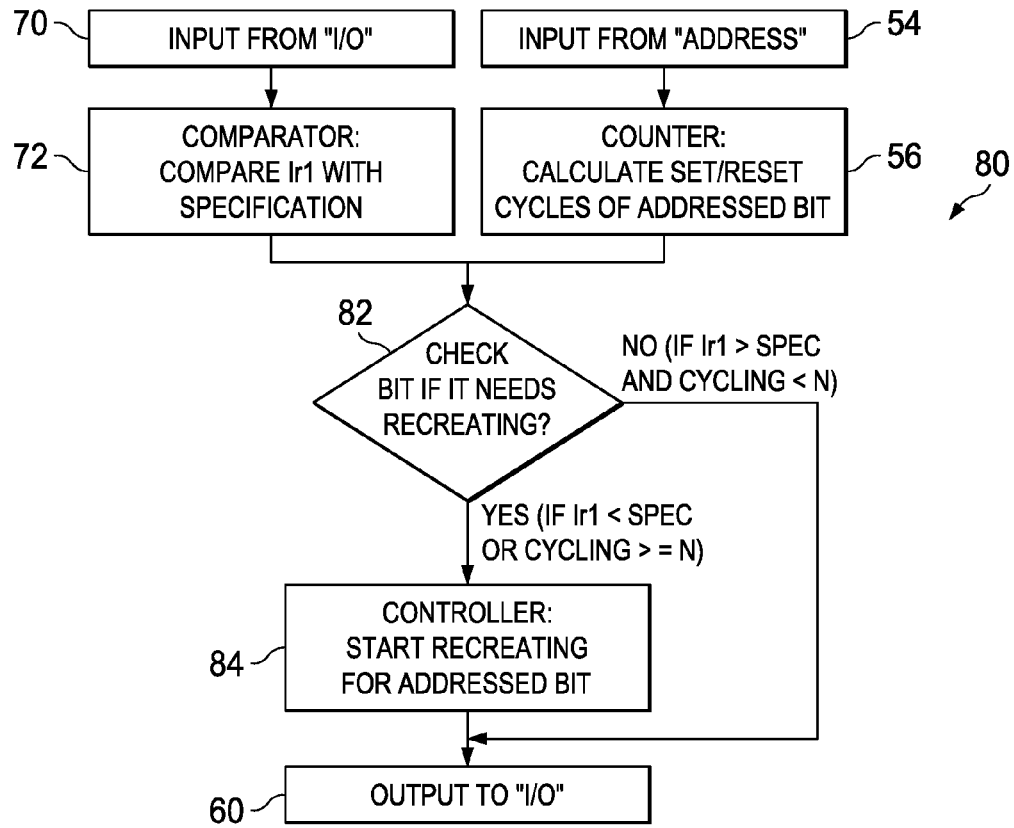
FIG. 9 is a flowchart of a method for operating the RRAM structure of FIG. 6 constructed according to aspects of the present disclosure in another embodiment.
FIG. 10 is a table illustrating various operations of the memory device of FIG. 10 constructed according to aspects of the present disclosure in one embodiment.

FIG. 9 is a flowchart of a method 80 of operating the RRAM structure of FIG. 6 constructed according to aspects of the present disclosure in another embodiment. Especially, the method 80 includes inserting a recreating process to a RRAM cell in a time and detection hybrid mode. In the present embodiment, the method 80 is enabled by and executed in the RRAM circuit 30. The method 80 is described with reference to FIGS. 6 and 9.

The method 80 begins at block 54 with input from the address module 38. The input includes the address associated with a RRAM cell of the RRAM array 32.

The address data is sent to the I/O circuit 42 to capture the reading current of the addressed RRAM cell as illustrated in block 70. In one embodiment, the reading current may be captured from the RRAM cell by an operation including set, read and reset.

As illustrated in block 72, the reading current of the addressed RRAM cell is sent to the comparator 50 to compare the reading current of the RRAM cell and a reference current.

The address data is also sent to the counter 48 to calculate the number of operation cycles associated with the addressed RRAM cell, as illustrated in block 56.

At block 82, the addressed RRAM cell is checked if a recreating process is needed in a time and detection hybrid mode. The time mode is similar to block 58 and it is based on the counting number of the operation cycles. The detection mode is similar to block 74 and it is based on the reading current and its comparison with the reference current. Either condition (the counting number or the reading current) is satisfied, a recreating process is triggered. Specifically, if the reading current is less than the reference current or if the number of set/reset operation cycles is equals to or greater than the predetermined number, a recreating process is applied to the addressed RRAM device to recreate filament.

The recreating process is started by the controller 46 as illustrated in block 84. Accordingly, the counting number of the addressed RRAM cell is reset to zero in the counter 48. Thereafter, the method 80 goes to perform the corresponding operation, such as reading the RRAM cell and sending the reading output to the I/O circuit 42, as illustrated in block 60.

If no condition (the counting number or the reading current) is satisfied, the method 80 goes to perform the corresponding operation, such as reading the RRAM cell and sending the reading output to the I/O circuit 42, as illustrated in block 60. Specifically, if the reading current is greater than the reference current and if the number of set/reset operation cycles is less than the predetermined number, a recreating process is skipped.

Figures 11, 12:
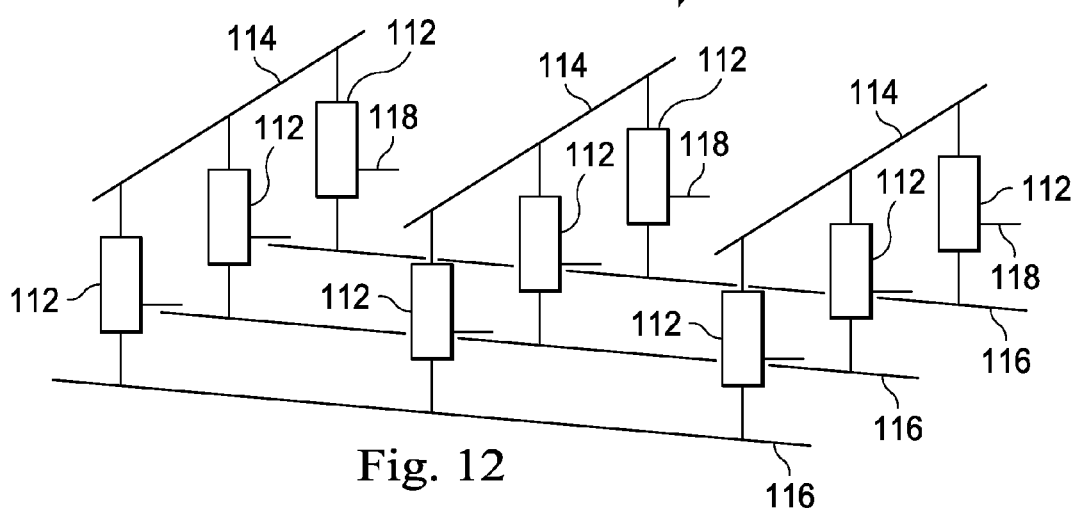
FIG. 11 is a table illustrating various operations of the memory device of FIG. 10 constructed according to aspects of the present disclosure in another embodiment.
FIG. 12 is a schematic view of the plurality of memory cells of FIG. 6 constructed according to aspects of the present disclosure in one embodiment.

Various RRAM operations in FIGS. 1, 7-9 are further described in various examples with reference to FIGS. 10 and 11. FIG. 10 is a table 86 that provides various operations constructed according to various embodiments. As described above, the RRAM cell is a three terminal device that includes word line ("WL"), bit line ("BL") and source line ("SL"). The operations to a RRAM cell include set, reset and read. The operation voltages are provided for both selected and non-selected cells.

FIG. 11 is a table 88 that provides a recreating operation constructed according to one embodiment. In the present embodiment, the recreating process is one step or two steps as described above. The terms WL, BL and SL in table 88 are same to the terms in table 86. The operations include a one-step recreating process ("$1^{st}\_step$") and a bidirectional recreating process (that includes two steps ("$1^{st}\_step$" and "$2^{st}\_step$"). The operation voltages are provided for both selected and non-selected cells.

FIG. 12 is a schematic view of the RRAM array 32 of FIG. 6 constructed according to aspects of the present disclosure in one embodiment. The RRAM array 32 includes a plurality RRAM cells 112 are configured in an array coupled with a plurality of word lines 114 and a plurality of bit lines 116. In one embodiment, the word lines 114 and the bit lines 116 are cross configured. Furthermore, each of the memory cells 112 is operable to achieve multiple resistance levels and accordingly multiple bit storage. In the present embodiment, source lines 118 are configured to connect to the memory cells, respectively. The source lines 118 may be configured such that one source line couples to one memory cell, or alternatively one source line couples a subset of the memory cells in the RRAM array 32. A memory cell 112, the method making the same and the method operating the same are collectively described below with reference to FIGS. 12 through 18.

Figure 13:
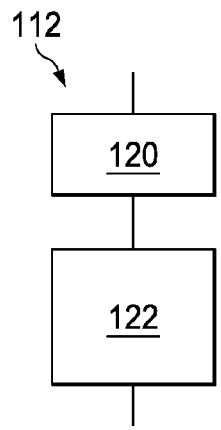
FIG. 13 is a schematic view of a memory cell of FIG. 12 having a resistive random access memory (RRAM) device and a current-controlling device constructed according to aspects of the present disclosure in various embodiments.

FIG. 13 is a schematic view of the memory cell 112 constructed according to one embodiment. Referring to FIG. 13, the memory cell 112 includes one resistive random access memory (RRAM) device 120 and a current-controlling device 122 connected together. The RRAM device 120 includes a resistive material layer (or a dielectric material layer) interposed between two electrodes. In one embodiment, the RRAM device 120 further includes a capping layer disposed between the dielectric layer and one of the electrodes.

Figure 14:
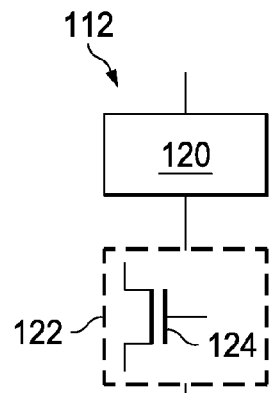
FIGS. 14 and 15 are schematic views of a memory cell of FIG. 12 having a RRAM device and a field-effect transistor (FET) constructed according to aspects of the present disclosure in various embodiments.

The current-controlling device 122 in the memory cell 112 is a device that is operable to control the current flow through the RRAM device 120 during the operations. In the present embodiment, the current-controlling device 122 is a transistor 124, such as a field effect transistor (FET), as illustrated in FIG. 14 in a schematic view. For example, the transistor 124 is a metal-oxide-semiconductor (MOS) FET. In a particular example, the one electrode of the RRAM device is connected to the drain of the transistor 124. The gate of the FET 124 is connected to the word line and the other electrode of the RRAM device 120 is connected to the bit line.

Figure 15:
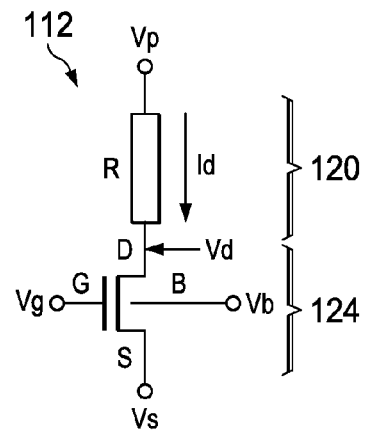

FIG. 15 is a schematic view of the memory cell 112 constructed according to aspects of the present disclosure in another embodiment. The memory cell 112 includes a RRAM device 120 and a FET 124 electrically connected. Particularly, one electrode of the RRAM device 120, such as bottom electrode, is connected to the drain of the transistor 124. The gate of the transistor 124 is connected to the word line. Another electrode of the RRAM device 120, such as top electrode, is connected to the bit line. The gate, source, drain and body of the transistor 124 are labeled as G, S, D and B, respectively. The corresponding voltages of the gate, source, drain and substrate during the operations are labeled as Vg, Vs, Vd and Vb, respectively. Furthermore, during the operation, the current through the RRAM device 120 is labeled as Id and the voltage applied to one electrode of the RRAM device 120 from the bit line is labeled as Vp.

In one embodiment, the memory cell 112 is a two terminal device with the gate of the transistor 124 as a first terminal and one electrode of the RRAM device 120 as a second terminal. The first terminal is controlled by a first voltage applied to the gate from the word line and the second terminal is controlled by a second voltage applied to the one electrode of the RRAM device from the bit line. In one example, the source is grounded, and the substrate (or the body of the transistor 124) is grounded or floating.

In the present embodiment, the memory cell 112 is a three terminal device, wherein the three terminals of the memory cell 112 includes the gate of the transistor 124 as a first terminal, the electrode of the RRAM device 120 (the electrode that is not directly connected with the drain of the transistor) as a second terminal and the source of the transistor 124 as a third terminal. Particularly, during the operations of the memory cell 112, the first terminal (gate) is controlled by a first voltage from the word line, the second terminal is controlled by a second voltage from the bit line, and the third terminal is controlled by a third voltage from a source line. In one example, the source is grounded. In an alternative example, the second terminal is grounded. The substrate (or the body) of the transistor 124 may be grounded or floating.

Figure 16:
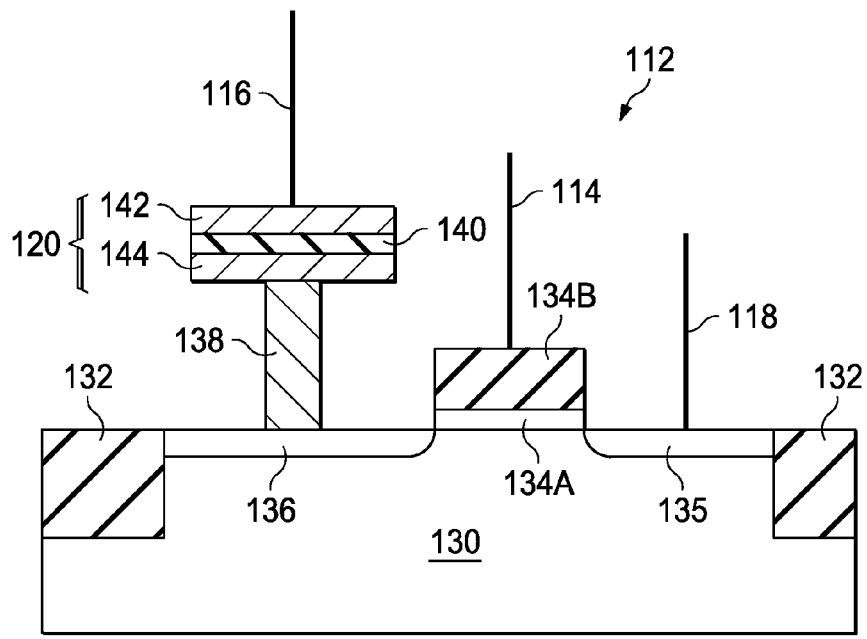
FIG. 16 is a sectional view of a memory cell of FIG. 14 having a RRAM device and a FET constructed according to aspects of the present disclosure in one embodiment.

FIG. 16 illustrates a sectional view of the memory cell 112 that includes the FET 124 and the RRAM device 120 formed on a substrate 130 and coupled together. In one example, the substrate 130 is a semiconductor substrate, such as a silicon substrate or alternatively other suitable semiconductor substrate. Various isolation features 132, such as shallow trench isolation (STI) features are formed on the substrate 130 and define various active regions. The FET 124 includes a gate 134 disposed on the substrate 130. The gate 134 includes a gate dielectric layer 134A and a gate electrode 134B disposed on the gate dielectric layer. In various examples, the gate dielectric layer includes a high k dielectric material and the gate electrode includes metal. The FET 124 further includes a source 135 and a drain 136 formed in the substrate 130. The gate 134 is horizontally interposed between the source 135 and the drain 136.

The RRAM 120 includes a resistive material layer 140 interposed between a top electrode 142 and a bottom electrode 144. In one embodiment, the resistive material layer includes a defect engineering film formed by a technique including a DET process. In another embodiment, the RRAM device 120 further includes a capping layer disposed between the dielectric layer and one of the electrodes. Furthermore, the resistive material layer of the RRAM device 120 includes filament features formed by a forming process, such as a bidirectional forming process or a single step forming process.

The memory cell 112 also includes various conductive features 138 to provide electrical routing and connection. The RRAM device 120 and the FET 124 are coupled together through one or more conductive features 138. In one embodiment, the drain 135 of the FET 124 is connected to the bottom electrode 144 of the RRAM device 120. The gate 134 of the FET 124 is connected to the word line 114. The top electrode of the RRAM device 120 is connected to the bit line 116. The source 135 of the FET 124 is connected to the source line 118. The conductive features 138 are portions of an interconnect structure formed on the substrate 130.

Figure 17:
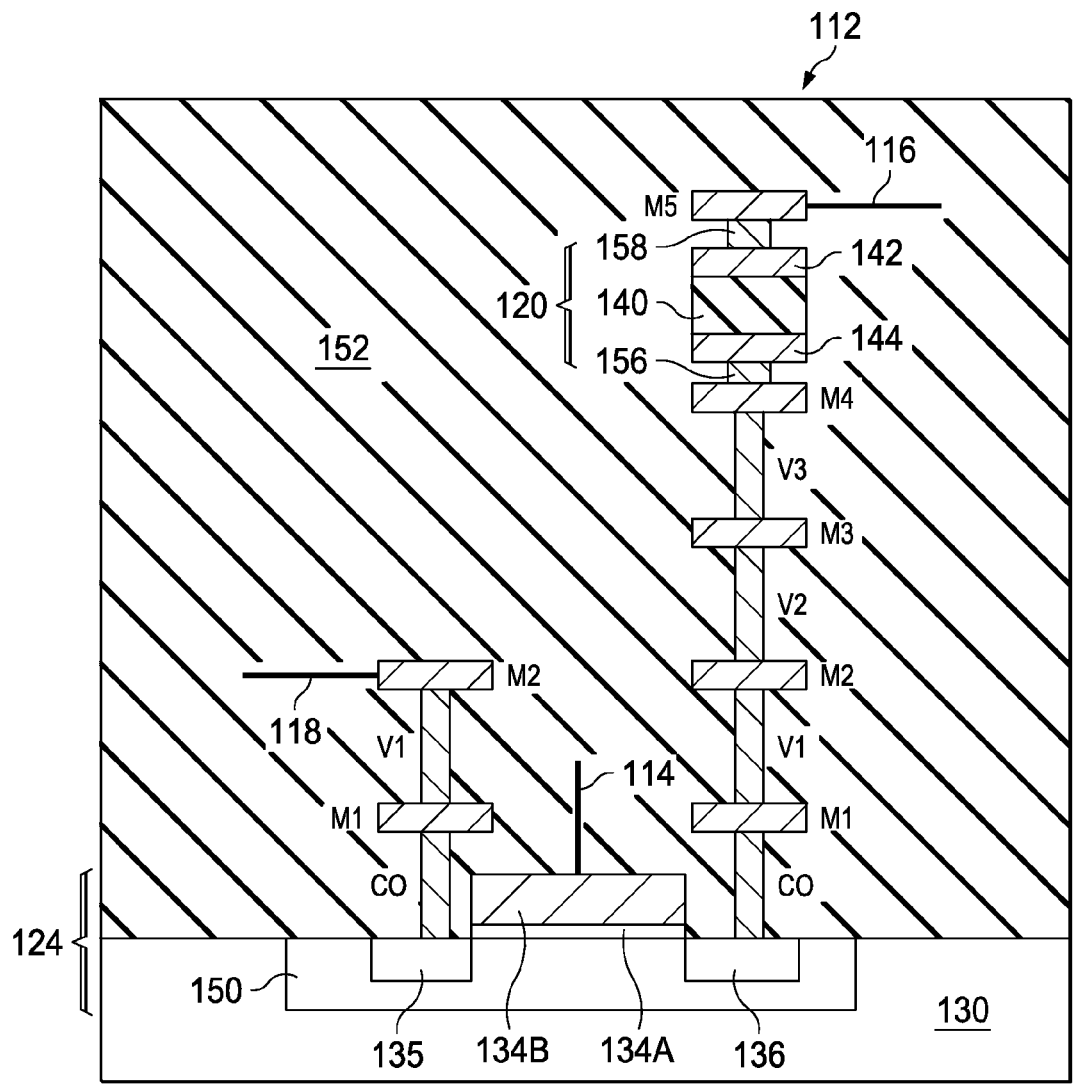
FIG. 17 is a sectional view of a memory cell of FIG. 14 having a RRAM device and a FET constructed according to aspects of the present disclosure in another embodiment.

FIG. 17 is a sectional view of the memory cell 112 constructed according to aspects of the present disclosure in one embodiment. The memory cell 112 includes the FET 124 formed in the substrate 130. Particularly, the FET 124 includes the source 135 and the drain formed in a doped well 150. The doped well is doped with a first type. The source 135 and the drain 136 are doped with a second type opposite to the first type. In the present example, the FET 124 is an n-type FET (nFET). Accordingly, the doped well 150 is p-type well. The source 135 and the drain 136 are n-type. The FET 124 includes the gate 134 formed on the substrate 130. The gate 134 includes a gate dielectric layer and a gate electrode disposed on the gate dielectric layer. The gate 134 is electrically connected to the word line 114 and the source 135 is connected to the source line 118.

The RRAM device 120 is formed in an interconnect structure 152. The interconnect structure 152 includes metal lines distributed in a plurality of metal layers, such as first metal layer (M1), M2 and so on. As an example for illustration, the interconnect structure 152 in FIG. 17 shows five metal layers that are respectively labeled as M1, M2, M3, M4 and M5. It is not meant to limit the scope of the disclosure, the interconnect structure 152 may include more or less metal layers. The interconnect structure 152 also includes contact features to provide connection between the substrate 130 and the first metal layer M1. The contact features are labeled as "CO". The interconnect structure 152 also includes via features to provide connection between adjacent metal layers (such as M1 and M2). The via features are labeled as V1, V2, V3 and V4 to represent the via features between M1 & M2, M2 & M3, and M3 & M4, respectively.

The RRAM device 120 is formed in the interconnect structure 152 and is disposed between two metal layers. In the example illustrated in FIG. 17, the RRAM device 120 is disposed between M4 and M5. The RRAM 120 includes the resistive material layer 140 interposed between the top electrode 142 and the bottom electrode 144. The bottom electrode 144 is directly contacted with a bottom via feature 156 and is further coupled to the drain 136 of the FET 124. The top electrode 142 is directly contacted with a top via feature 158 and is further coupled to the bit line 116.

The RRAM cell 112 may include other features, such as shallow trench isolation (STI) formed in the substrate 130 to provide isolation to various RRAM cells and other devices. In another embodiment, the source line 118 is connected to the source 135 through various conductive features, such as conductive features in CO, M1, V1 and M2 in this example.

The RRAM cell 112 is formed by a method constructed according to aspects of the present disclosure in various embodiments. The method includes an operation to form isolation features in the substrate 130. In one example, the isolation features include STI features that are formed by a procedure including etching and deposition. In one example to form the STI features, an etching process is applied to form trenches in the substrate. One or more dielectric material is deposited in the trenches. A polishing process, such as chemical mechanical polishing (CMP), is performed to planarize the surface of the substrate. After the formation of the isolation features, the active regions are defined in the substrate 130 for the RRAM cell 112 and other devices to be formed thereon.

The method includes an operation to form the doped well 150 by a suitable technique, such as ion implantation. The method proceeds to form the gate 134. One operation is applied to form gate dielectric, such as silicon oxide, high k dielectric material or combination thereof. In one example, the gate oxide is formed by a procedure including a first thermal oxidation, patterning, and a second thermal oxidation.

The method also includes an operation to form the FET 124. The operation further includes depositing one or more conductive material and patterning the conductive material and the gate oxide to form gate dielectric and gate electrode, respectively. The operation further includes forming source 135 and drain 136 by various ion implantation. In one embodiment, a first ion implantation is applied to the substrate 130 to form light doped drain (LDD) feature; gate spacers are formed on sidewall of the gate 134 by deposition and anisotropic etching; and thereafter a second ion implantation is applied to the substrate to form heavily doped source and drain features that are offset from the LDD features by the gate spacers. The gate electrode may include doped polycrystalline silicon, metal or metal alloy according to different embodiments.

The method includes an operation to form silicide features on the source 135 and drain 136 for reduced contact resistance. Salicide may be further formed on the gate. In one embodiment, the silicide features are formed by a procedure including metal deposition, annealing and etching.

The method includes an operation to form contact features "CO" by a suitable procedure that includes dielectric deposition, lithography patterning and etching. The method includes an operation to various interconnect features. In the present embodiment, the operation includes forming various conductive features including M1, V1, M2, V2, M3, V3 and M4. In one embodiment, each metal layer, including metal lines and the via features, is formed by a damascene process including dielectric material deposition, etching to form trenches, metal deposition to fill in the trenches and CMP to remove the excessive metal. In another embodiment, each metal layer is formed by metal deposition, metal patterning and dielectric deposition. The method includes an operation to form a bottom via feature 156. In one embodiment, the bottom via feature 156 is formed by a damascene process.

The method includes an operation to form a RRAM device 120. The formation of the RRAM device 120 includes deposition and pattering to form bottom electrode 142, resistive material layer 140 and top electrode 144. The method includes an operation to form a top via feature 156. In one embodiment, the top via feature 156 is formed by another damascene process.

The method includes an operation to form a metal line on the top via feature 156. In the present example, the metal line is in the fifth metal layer. The formation of the metal line in the fifth metal layer is similar to the formation of the metal lines in the other metal layers. For example, the metal line on the top via feature 156 is formed by a damascene process. In another embodiment, the metal line is formed by metal deposition and patterning.

Figure 18:
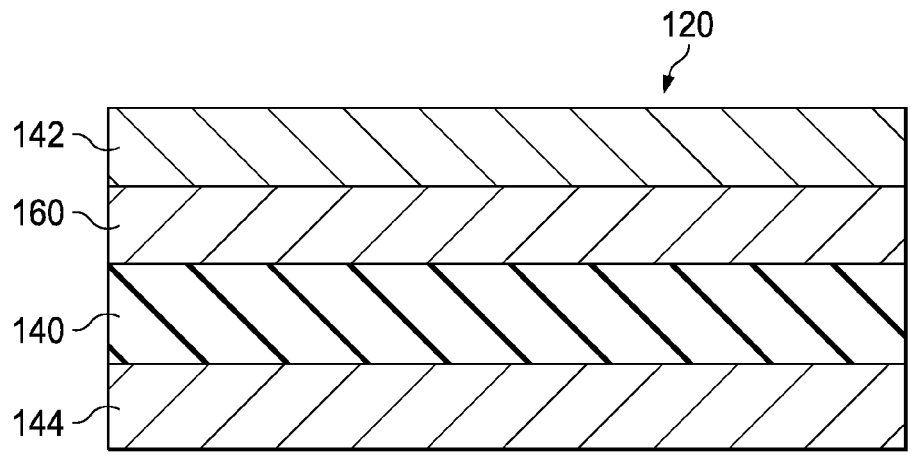
FIG. 18 is a sectional view of the RRAM device of FIG. 14 constructed according to aspects of the present disclosure in another embodiment.

FIG. 18 is a sectional view of the RRAM device 120 constructed according to aspects of the present disclosure in various embodiments. The method to form the RRAM device 120 is further described with reference to FIG. 18.

The method includes a step to form the bottom electrode (or first electrode) 44 of a conductive material. In one embodiment, the bottom electrode 144 includes titanium nitride (TiN). In another embodiment, the bottom electrode 144 includes tantalum nitride (TaN) or platinum (Pt). In other embodiments, the bottom electrode 144 may include other appropriate conductive materials for forming such an electrode, such as metal, metal nitride, doped polycrystalline silicon (doped poly silicon) or combinations thereof.

In one embodiment, the bottom electrode 144 includes a conductive material having a proper work function such that a high work function wall is built between the bottom electrode 144 and the resistive material layer 140. The bottom electrode 144 can be formed by atomic layer deposition (ALD), physical vapor deposition (PVD or sputtering), or alternatively other suitable processes. In one example, the bottom electrode 144 includes TiN and is formed by an ALD process using a precursor including TiCl4 and NH3.

The method includes a step by forming the resistive material layer (or sometimes referred to as a dielectric material layer) 140 on the bottom electrode 144. The resistive material layer 140 has a characteristic mechanism that its resistivity can be switched between a high resistance state and a low resistance state (or conductive), by applying an electrical voltage. In various embodiments, the resistive material layer 140 includes metal oxide, metal oxynitride or combinations thereof. In the present embodiment, the resistive material layer 140 includes a transition metal oxide (TMO). In one example, the resistive material layer 140 includes zirconium oxide. In other examples, the resistive material layer 140 includes tantalum oxide or hafnium oxide.

The resistive material layer 140 may be formed by a suitable technique, such as ALD with a precursor containing zirconium and oxygen. In another example, the resistive material layer 140 may be formed by PVD, such as a PVD process with a zirconium target and with a gas supply of oxygen to the PVD chamber. The resistive material layer 140 has a proper thickness for improved memory device performance including retaining time, reliable data storage, and writing easiness.

The method may include a step to form a capping layer 160 on the resistive material layer 140. The capping layer 160 includes a conductive material that is unstable and is capable of depriving oxygen from adjacent material. In the present embodiment, the capping layer 160 includes titanium (Ti) and may be formed by PVD or other suitable technique.

In other embodiments, the capping layer 160 includes Ti, tantalum (Ta) or hafnium (Hf). In another embodiment, the capping layer 160 includes metal oxide. In yet other embodiments, the capping layer 160 and the resistive material layer 140 are chosen to have a pair of a conductive material and a resistive material, such as titanium (Ti) and zirconium oxide; or tantalum and tantalum oxide; or hafnium and hafnium oxide. However, the capping layer 160 may be eliminated in other embodiments.

The method includes a step by forming the top electrode (or second electrode) 142 on the capping layer 160 or on the resistive material layer 140 (if the capping layer 160 is not present). In one embodiment, the top electrode 142 includes tantalum nitride (TaN). The top electrode 142 may be formed by PVD or other suitable technique. Alternatively, the top electrode 142 includes other suitable conductive material to electrically connect the device to other portion of an interconnect structure for electrical routing. In other embodiments, the top electrode 142 includes metal, metal-nitride, doped polysilicon or other suitable conductive material.

The method includes a step to pattern the various material layers to form one or more RRAM device. Particularly, the bottom electrode 144 and the top electrode 142 are defined by patterning. In one embodiment, the various RRAM material layers (such as the resistive material layer 140, the capping 160 and the two electrodes) are patterned by a procedure that includes lithography process and etch. In one embodiment, the RRAM material layers may be patterned by more than one patterning procedures.

The "forming" process (or operation) used in above methods is described below according various embodiments. The forming process is designed to change the structure of the resistive material layer 140 of the RRAM device 120 such that a conductive path is generated therein. In the present embodiment, filament features are generated in the resistive material layer 140 of the RRAM device 120.

In the forming process, a forming voltage is applied to the two electrodes of the RRAM device 120. For example, the bottom electrode is connected to a low voltage $V_{low}$ and the top electrode is connected to a high voltage $V_{high}$. The difference of $V_{high}-V_{low}$ provides the forming voltage. In the "forming" operation, the "forming" voltage is high enough to generate conductive features in the resistive material layer 140. In one example, the conductive features include a plurality of conductive filament to provide a conductive path such that the resistive material layer 140 is "on" or in low resistance state. The conductive path may be related to the lineup of the oxygen vacancies in the resistive material layer 140.

In one embodiment, the forming process is a bidirectional process that includes two steps: a first forming step applies a first (forming) voltage Vf1 to the RRAM device 120 and a second forming step applies a second (forming) voltage Vf2 to the RRAM device 120, wherein the second voltage is different from the first voltage. Particularly, in the first forming step, the first voltage is applied to the RRAM device 120 in a first direction (or first polarity). In the second forming step, the second voltage is applied to the RRAM device 120 in a second direction (or second polarity) that is opposite to the first direction. In one embodiment, the first voltage Vf1 is greater than the second voltage Vf2 in magnitude. The first forming step effectively reduces the sizes of the conductive filaments (CF) generated in the resistive material layer 140. The second forming step creates vacancy on the top side of the resistive material layer 140.

In various embodiments, various advantages may present. For example, since a recreating process is inserted in the normal operations in time mode, detection mode or hybrid mode, the resistance and reading current are at least partially recovered, especially for the low resistance state of the RRAM cell, the reading performance and reliability are improved with a large, stable and reliable windows.

The present disclosure provides one embodiment of a method for operating a resistive random access memory (RRAM) cell. The method includes performing a forming operation to the RRAM cell with a forming voltage; performing a number of set/reset operation cycles to the RRAM cell; and performing a recreating process to the RRAM cell to recover RRAM resistance by applying a recreating voltage that is greater than a set voltage.

The present disclosure also provides another embodiment of a method for operating a resistive random access memory (RRAM) cell. The method includes performing a forming operation to the RRAM cell with a forming voltage; performing a plurality of set/reset operation cycles to the RRAM cell; and performing a recreating process to the RRAM cell to recover RRAM resistance according to a recreating condition.

The present disclosure also provides an embodiment of a resistive random access memory (RRAM) structure. The RRAM structure includes a plurality of RRAM cells configured in an array; a word line decoder and a bit line decoder coupled to the RRAM cells; an input/output (I/O) circuit coupled to the bit line decoder; and a recreating module coupled to the word line decoder and the bit line decoder through an address module, wherein the recreating module is operable to perform a recreating process to a cell in the array when the cell is degraded by set and reset operations.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for operating a resistive random access memory (RRAM) cell, comprising:
   performing a forming operation to the RRAM cell with a forming voltage;
   performing a number of set/reset operation cycles to the RRAM cell, wherein each of the number of set/reset operation cycles includes a set operation with a set voltage; and
   performing a recreating process to the RRAM cell to recover RRAM resistance by applying a recreating voltage that is greater than the set voltage, wherein the recreating voltage is less than the forming voltage.

2. The method of claim 1, wherein the performing a recreating process includes
   performing a first recreating operation by applying the recreating voltage to the RRAM cell in a first polarity; and
   performing a second recreating operation by applying another voltage to the RRAM cell in a second polarity that is opposite to the first polarity.

3. The method of claim 2, wherein
   the first polarity is a polarity to apply a set operation, and
   the another voltage is greater than a reset voltage.

4. The method of claim 1, further comprising:
   counting the number of set/reset operations to the RRAM cell; and
   initiating the recreating process when the number of set/reset operation cycles is greater than a predefined number.

5. The method of claim 4, wherein the counting the number of set/reset operation cycles includes adding one to a counter each time when the RRAM cell is addressed for a set/reset operation cycle.

6. The method of claim 5, further comprising resetting the counter to zero after the initiating the recreating process.

7. The method of claim 1, further comprising:
   extracting reading current of the RRAM cell;
   comparing the reading current with a predefined current; and
   initiating the recreating process when the reading current is less than the predefined current.

8. A method for operating a resistive random access memory (RRAM) cell, comprising:
   performing a forming operation to the RRAM cell with a forming voltage;
   performing a plurality of set/reset operation cycles to the RRAM cell; and
   performing a recreating process to the RRAM cell to recover RRAM resistance according to a recreating condition, wherein performing the recreating process to the RRAM cell includes applying a recreating voltage to the RRAM cell, and the recreating voltage is greater than a set voltage and less than the forming voltage.

9. The method of claim 8, wherein the recreating process includes a signal selected from one of direct current (DC), alternating current (AC) and pulsed signal.

10. The method of claim 8, wherein the recreating condition includes at least one of
    when a number of set/reset operations is equals to a predetermined number, and
    when a reading current of the RRAM cell is less than a reference current.

11. The method of claim 8, wherein the performing a recreating process includes
    performing a first recreating operation by applying the recreating voltage to the RRAM cell in a first polarity; and
    performing a second recreating operation by applying another voltage to the RRAM cell in a second polarity that is opposite to the first polarity.

12. The method of claim 11, wherein
    the first polarity is a polarity to apply a set operation,
    the second polarity is a polarity to apply a reset operation, and
    the another voltage is greater than a reset voltage.

13. The method of claim 8, further comprising:
    adding one to a counter each time the RRAM cell is addressed for a set/reset operation cycle;

performing the recreating process when the number of set/reset operation cycles is greater than a predefined number; and resetting the counter to zero after the performing the recreating process.

14. The method of claim 8, further comprising:

extracting a reading current of the RRAM cell;

comparing between the reading current and a reference current; and performing the recreating process if the reading current is less than a predefined current.

15. A resistive random access memory (RRAM) structure, comprising:

a plurality of RRAM cells configured in an array;

a word line decoder and a bit line decoder coupled to the RRAM cells;

an input/output (I/O) circuit coupled to the bit line decoder; and a recreating module coupled to the word line decoder and the bit line decoder through an address module, wherein the recreating module is operable to perform a recreating process to a cell in the array when the cell is degraded by set and reset operations, wherein performing the recreating process includes performing a first recreating operation by applying a recreating voltage to the cell in a first polarity and performing a second recreating operation by applying another voltage to the cell in a second polarity that is opposite to the first polarity, wherein the first polarity is a polarity to apply a set operation and the second polarity is a polarity to apply a reset operation, and wherein the another voltage is greater than a reset voltage.

16. The RRAM structure of claim 15, wherein the recreating module includes a controller that is operable to control a recreating process to the cell in the array by applying the recreating voltage.

17. The RRAM structure of claim 16, wherein the recreating module includes a comparator coupled with the controller, the comparator is operable to compare read current from the cell to a reference current, and the controller is operable to initiate the recreating process to the cell when the reading current is below the reference current.

18. The RRAM structure of claim 16, wherein the recreating module includes a counter coupled with the controller, the counter is operable to count a number of set/reset operation cycles to the cell, and the controller is operable to initiate the recreating process to the cell when the number of set/reset operation cycles is equals to or greater than a predefined number.

19. The RRAM structure of claim 18, wherein the counter is operable to increase the number of operation cycles to the cell by one if the cell is addressed for a set/reset operation cycle.

20. The RRAM structure of claim 15, further comprising a sense amplifier connected between the I/O circuit and the bit line decoder.

21. The method of claim 1, wherein the recreating process includes a signal selected from one of direct current (DC), alternating current (AC) and pulsed signal.

22. The method of claim 1, wherein performing the recreating process to the RRAM cell occurs after a reading current of the RRAM cell is different than a reference current.

* * * * *